United States Patent [19]
Lebrun et al.

[11] Patent Number: 6,064,713
[45] Date of Patent: May 16, 2000

[54] SHIFT REGISTER USING "MIS" TRANSISTORS OF LIKE POLARITY

[75] Inventors: Hughes Lebrun, Coublevie; François Maurice, Tullins; Eric Sanson, Grenoble, all of France

[73] Assignee: Thomson LCD, Paris

[21] Appl. No.: 08/926,536

[22] Filed: Sep. 10, 1997

[51] Int. Cl.[7] .................................................. G11C 19/00
[52] U.S. Cl. ................................. 377/67; 377/78; 377/79
[58] Field of Search .................................. 377/78, 79, 67

[56] References Cited

U.S. PATENT DOCUMENTS 5,434,899  7/1995  Huq et al. ................................. 377/79

FOREIGN PATENT DOCUMENTS

720185  11/1995  France .

Primary Examiner—Margaret R. Wambach
Attorney, Agent, or Firm—Joseph S. Tripoli; Joseph J. Laks; Harvey D. Fried

[57] ABSTRACT

A shift register having several cascaded stages, each stage containing an output at a first node connected to a next stage, a first input connected to an output of a preceding stage, a second input connected to an output of the next stage and a first terminal connected to a first clock signal and a second terminal connected to a second clock signal, the stage containing a first semiconductor device switching the output of the stage between high and low values of the first clock signal, the first semiconductor device being controlled by the potential of a second node, itself connected to the output of the preceding stage across a second semiconductor device controlled by the output of the preceding stage; to a negative potential across a third semiconductor device controlled by the output of the next stage; and to the second terminal connected to the second clock signal across a first capacitance, wherein a second capacitance is mounted between the second node and the output of the next stage.

21 Claims, 5 Drawing Sheets

SHIFT REGISTER USING "MIS" TRANSISTORS OF LIKE POLARITY

FIELD OF THE INVENTION

The present invention relates to shift registers using "MIS" (standing for Metal, Insulator, Semiconductor) transistors of like polarity. It relates more particularly to an enhancement to shift registers using a limited number of "MIS" transistors of like polarity and allowing the selection of the lines of pixels of a flat screen.

BACKGROUND OF THE INVENTION

A flat screen, especially a liquid-crystal flat screen, is made up of a number of electro-optical cells arranged in rows and columns, each controlled by a switching device and containing two electrodes bordering a liquid crystal whose optical properties are modified as a function of the value of the field traversing it. The assembly consisting of the switching device, the electrode, the liquid crystal, the counterelectrode constitutes what is termed a "pixel" or image point. The addressing of these pixels is performed by way of selection lines which control the on and off state of the switching devices and of columns or lines of data which transmit, when the switching device is on, a voltage applied to the terminals of the electrodes corresponding to the data signal to be displayed, namely to a grey scale.

According to a particularly advantageous embodiment, the electrodes, the switching devices, the lines and the columns are deposited and etched on the same substrate board in such a way as to constitute the active matrix of the screen. In this case, the peripheral control circuits, that is to say the selection line scanner which selects the horizontal lines to be displayed and the circuits which control the columns can be integrated directly onto the substrate board containing the active matrix and can be manufactured at the same time as the latter. These therefore make it necessary, especially when the number of pixels is very high, to have the smallest and simplest possible control circuits so as to achieve a high degree of manufacturing efficiency. It may moreover be advantageous to use semiconductor devices as pixel switching devices with the same conductivity type throughout the display.

Control of the semiconductor devices can be undertaken by lines addressed by one or more shift registers. A shift register structure which makes it possible in particular to meet the simplicity requirements alluded to in the previous paragraph has been described in International Patent Application WO 92/15992 filed in the name of THOMSON-LCD. In this case, a stage of a shift register contains six transistors and is fed with two clock signals and also from two positive sources and one negative source. The operation of this register relies on the fact that the gate of the transistor which controls the output of the stage of the register is left floating and that its potential therefore follows the potential of the clock and of the output, through a capacitive effect. This effect is termed the "bootstrap" effect. It allows, at the desired moment, complete charging of the output to the highest potential of the clock. With this output transistor are associated a transistor allowing the gate of the output transistor to be precharged and a transistor allowing it to be discharged. On the other hand, the operation of these three transistors is such that although the "bootstrap" effect allows proper charging of the outputs, it is accompanied by stray effects which make it necessary to use three supplementary transistors. Another drawback resides in the fact that certain transistors undergo permanent gate stress, namely a positive voltage on the gate, a consequence of which may be the drifting of their threshold voltage and may give rise in due course to a malfunction of the entire device.

To remedy the aforesaid drawbacks, French Patent Application No. 94 05987 filed on May 17, 1994 in the name of THOMSON-LCD proposes simpler circuits with three or four transistors having prolonged lifetimes.

Figure 1:
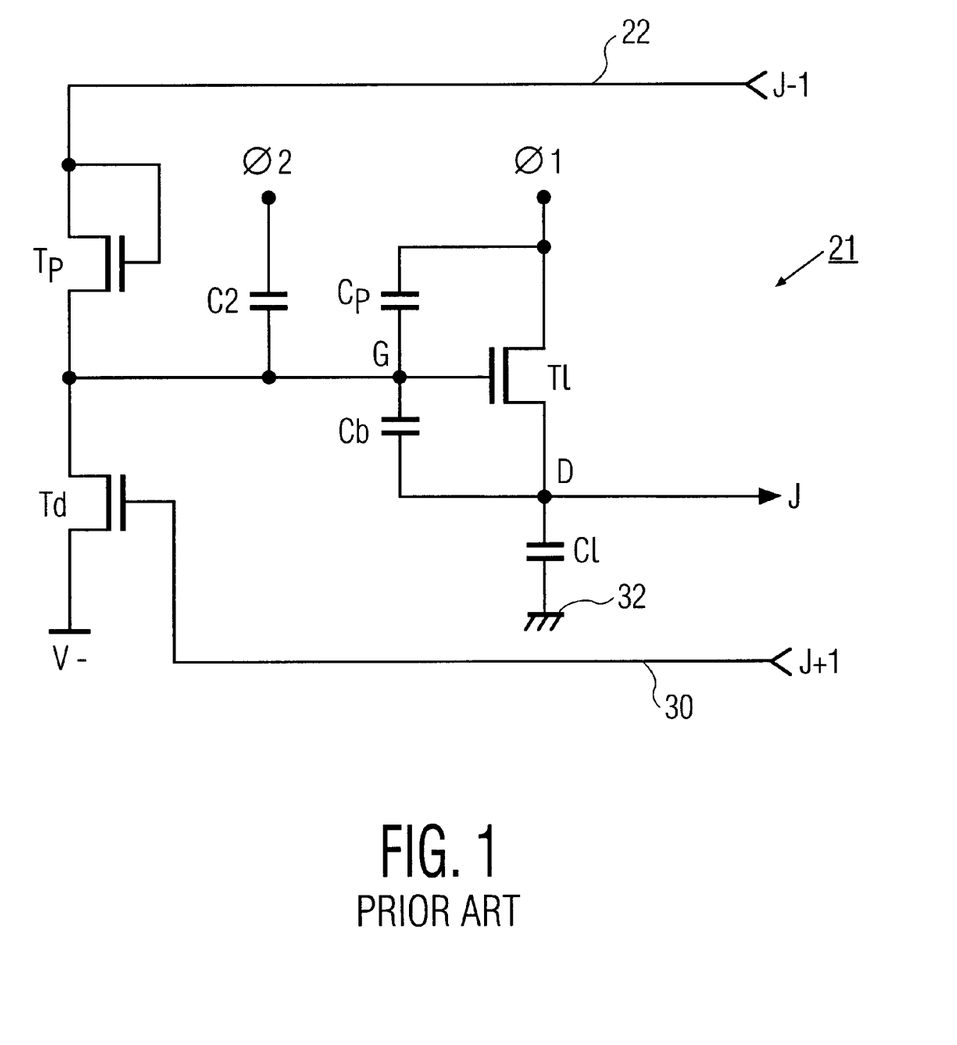
FIG. 1 represents a stage 21 of a shift register according to the prior art.

Thus, as represented in FIG. 1 which corresponds to FIG. 2 of French Patent Application No. 94 05987, a stage 21 of a shift register making it possible to control the selection lines is made up of three transistors Tl, Tp and Td. In this case, the transistor Tl controls the node D of the output on the line J. It is precharged by the transistor Tp and discharged by the transistor Td. More precisely, the stage 21 is connected at 22 to the preceding line J−1 via the drain of the transistor Tp. The gate of the transistor Tp is connected to its drain whereas its source is connected to the point G, itself connected to the gate of the transistor Tl. On the other hand, the point G is linked to a negative voltage V− by way of the discharge transistor Td, itself controlled by the potential of the line J+1 connected at the output of the next stage. Moreover, the node D is connected to the source of the transistor Tl, to the node G by way of a capacitance Cb and to the line J to be selected whose charging is symbolized electrically by a capacitance Cl linked to earth 32. A clock signal $\phi 1$ is applied to the drain of the output transistor Tl. Between the drain and the gate of this transistor there is a stray capacitance Cp responsible for the "bootstrap" effect explained with reference to the Application WO 92/15992. Moreover in this layout, a clock $\phi 2$ exactly complementary to the clock $\phi 1$ is connected to the node G by way of a capacitance C2 of a value equivalent to that of the stray capacitance Cp.

Thus the stray effects, the consequence of the "bootstrap" effect, are counter-balanced by virtue of the linking of the clock $\phi 2$ (complementary to the clock $\phi 1$) with the gate of the transistor Tp by way of the capacitance C2 of value Ct equivalent to that of Cp. The two clocks being exactly complementary, they induce no stray voltage at the node G, namely on the gate of the transistor Tl. An equivalent circuit contains a capacitance Cl=2×Ct between the node G and earth 32. Such a structure reducing the "bootstrap" effect, it is necessary to add a "bootstrap" capacitance Cb between the source node D and the gate node G so that the voltage of the gate follows a fraction Cb/(Cb+2×Cp) of the variations in the source voltage. Thus, it suffices, in order that a "bootstrap" ratio of 60% be attained, that Cb have three times the value of Ct. The circuit described above preserves the "bootstrap" effect without its secondary effects. The lifetime of the circuit and hence of the entire device is prolonged while the number of transistors required is halved as compared with the prior art.

Figure 2A:
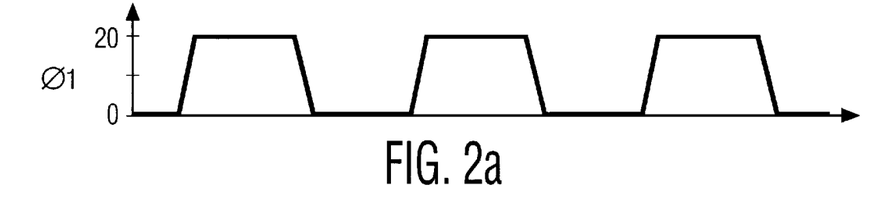
FIGS. 2a to 2f represent the timing diagram of the various signals of the device of FIG. 1.
Figure 2B:
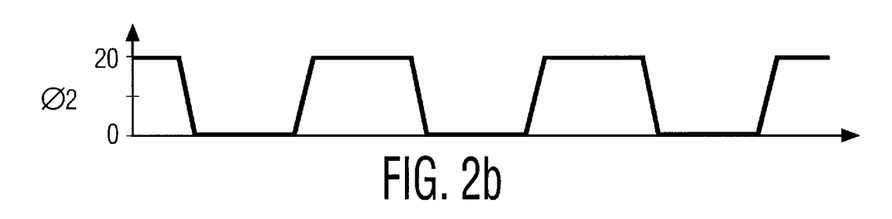
Figure 2C:
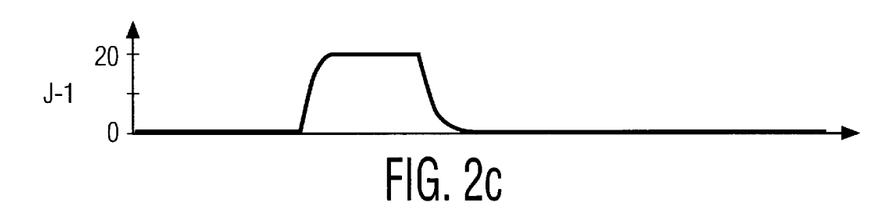
Figure 2D:
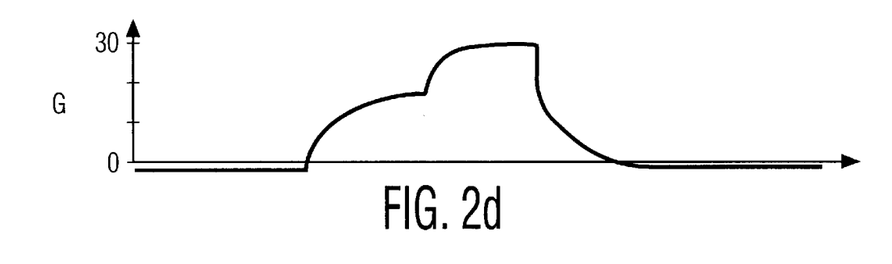
Figure 2E:
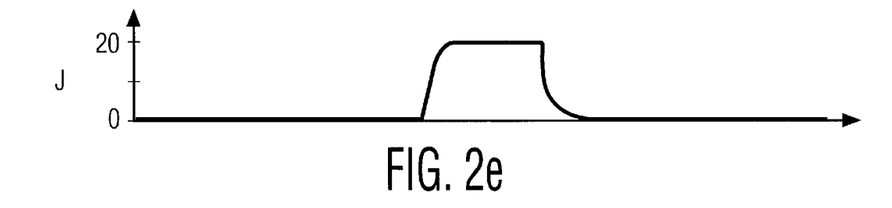
Figure 2F:
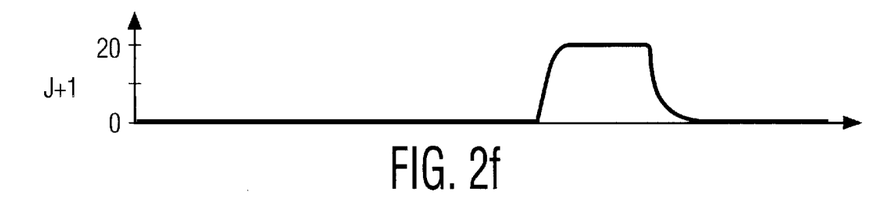

The operation of the circuit is explained with reference to the timing diagrams 2a to 2f each of them showing a timescale as abscissa and a potential as ordinate. When the preceding stage J−1 sends a pulse (FIG. 2c) in 22, the precharge transistor Tp is on and charges the "bootstrap" capacitance Cb. The potential of the node G (FIG. 2d) rises to that of the line J−1 corresponding to the preceding stage, from which must be deducted substantially the value of the threshold voltage of the transistor Tp. The transistor Tl is then on. When the clock $\phi 1$ rises in turn (FIG. 2a) the output J follows, carrying with it the gate of the transistor Tl by virtue of the "bootstrap" capacitance (FIG. 2d). The transistor Tl is then fully on and the node D and the line J follow the potential of the clock $\phi 1$ perfectly (FIG. 2e) until it falls. At this moment, the next line J+1 rises (FIG. 2f) and turns on the transistor Td which discharges the "bootstrap" capacitance Cb so that the transistor Tl is no longer on for the succeeding clock beats (FIG. 2d).

Figure 3:
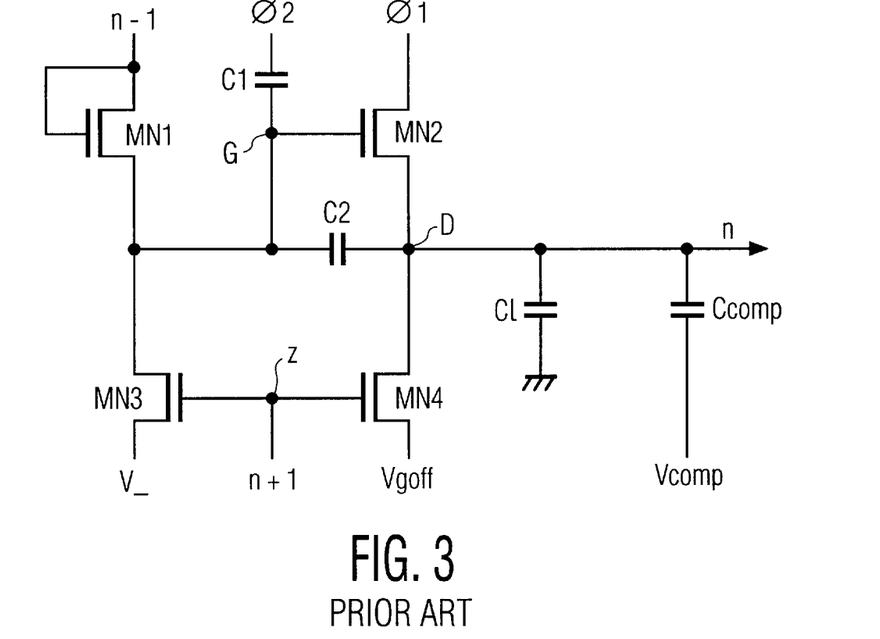
FIG. 3 represents another embodiment of a stage of a shift register according to the prior art.

The circuit described with reference to FIG. 1 has been enhanced in French Patent Application No. 94 05987 by adding a transistor which makes it possible to work with control signals having an amplitude of 5 to 10 volts less than that of the output signals. This solution is represented in FIG. 3. This figure depicts three transistors MN2, MN1 and MN3 which are equivalent to the transistors Tl, Tp and Td, the two inputs n−1 and n+1 equivalent to J−1 and J+1, the two clock inputs φ1 and φ2 in phase opposition, the output n of the stage equivalent to the output J as well as the capacitances C1, C2 CR corresponding respectively to the capacitances C2, Cb, Cl of the embodiment described with reference to FIG. 1. In this case there is provided a reset-to-zero transistor MN4 which connects the node D to a negative voltage Vgoff. The gate of the transistor MN4 is connected to the node Z, itself linked to the output of the next stage n+1 or to the line n+2, that is to say to the output line of the next but one stage. As described in the French Application, such a structure allows resetting to zero with a simplified circuit. Moreover, provided between the output line n and a voltage Vcomp is a compensation capacitance C comp.

SUMMARY OF THE INVENTION

The objective of the present invention is to make various enhancements to the circuits described above.

Accordingly, the subject of the present invention is a shift register containing a plurality of cascaded stages, each stage containing an output at a first node and being connected to the output of the preceding stage, to the output of the next stage and to means delivering first and second clock signals, the said stage containing a first semiconductor output device switching the output between high and low values of the first clock signal, the first semiconductor device being controlled by the potential of a second node, itself connected:

to the output of the preceding stage across a second semiconductor device controlled by the output of the preceding stage;

to a negative potential across a third semiconductor device controlled by the output of the next stage;

to the means delivering the second clock signal across a first capacitance, characterized in that it includes a capacitance mounted between the second node and the output of the next stage.

This capacitance makes it possible to delay the signal fall applied to the gate of the output transistor. This capacitance makes it possible to remedy the fact that the size and characteristics of the discharge transistor are critical. Thus, the discharge transistor must be dimensioned in such a way as to not discharge the gate of the output transistor too quickly. If the gate of the output transistor is discharged before the clock pulse φ1 falls, then the discharge time of the capacitance linked to the clock φ2 increases in a non negligible manner. The use of a supplementary capacitance therefore makes it possible to delay the fall in the voltage applied to the gate of the output transistor.

The subject of the present invention is also a shift register containing a plurality of cascaded stages, each stage containing an output at a first node and being connected to the output of the preceding stage, to the output of the next stage and to means delivering first and second clock signals, the said stage containing a first semiconductor output device switching the output between high and low values of the first clock signal, the first semiconductor device being controlled by the potential of a second node, itself connected:

to the output of the preceding stage across a second semiconductor device controlled by the output of the preceding stage;

to a negative potential across a third semiconductor device controlled by the output of the next stage;

to the means delivering the second clock signal across a first capacitance, characterized in that it includes means for latching the control voltage of the second semiconductor device at a value less than or equal to zero.

According to a preferred embodiment, these means consist of a capacitance connected between the control of the second semiconductor device and the output of the preceding stage and a fifth semiconductor device connected between the control of the second semiconductor device and a negative voltage, the fifth semiconductor device being controlled by the said negative voltage.

The use of this device makes it possible to maintain the control of the second precharge semiconductor device at a voltage sufficient to prevent any voltage upturn of the control of the semiconductor output device.

A further subject of the present invention is a shift register containing a plurality of cascaded stages, each stage containing an output at a first node and being connected to the output of the preceding stage, to the output of the next stage and to means delivering first and second clock signals, the said stage containing a first semiconductor output device switching the output between high and low values of the first clock signal, the first semiconductor device being controlled by the potential of a second node, itself connected:

to the output of the preceding stage across a second semiconductor device controlled by the output of the preceding stage;

to a negative potential across a third semiconductor device controlled by the output of the next stage;

to the means delivering the second clock signal across a first capacitance, characterized in that it includes means for maintaining the output line at a low level.

According to a preferred embodiment, these means consist of a sixth semiconductor device connected between the output line and a negative voltage Vgoff., the sixth semiconductor device being controlled by reset-to-zero pulses.

This makes it possible to compensate for the leakage currents through the first semiconductor device.

A further subject of the present invention is a shift register containing a plurality of cascaded stages, each stage containing an output at a first node and being connected to the output of the preceding stage, to the output of the next stage and to means delivering first and second clock signals, the said stage containing a first semiconductor output device switching the output between high and low values of the first clock signal, the first semiconductor device being controlled by the potential of a second node, itself connected to the means delivering the second clock signal across a first capacitance:

characterized in that it is connected moreover:

to a first high or low potential across a second semiconductor device controlled by the output of the preceding stage, and to a second low or high potential across a third semiconductor device controlled by the output of the next stage.

A bi-directional line control circuit is thus obtained. It makes it possible to shift the information from stage n−1 to stage n+1 from stage n+1 to stage n−1 depending on the polarity of the first and second potentials.

BRIEF DESCRIPTION OF THE DRAWINGS

Other characteristics and advantages of the present invention will emerge on reading the description of various embodiments given below with reference to the appended drawings in which.

To simplify the description in FIGS. 4 to 8, the same elements as those of FIG. 3, already described, bear the same references.

DETAILED DESCRIPTION OF PREFERRED EMBODIMENTS

In the description which will follow, the semiconductor devices consist of transistors, more particularly MOS transistors and even thin film transistors (TFTs). The invention is however, not limited to transistors of this type.

Figure 4:
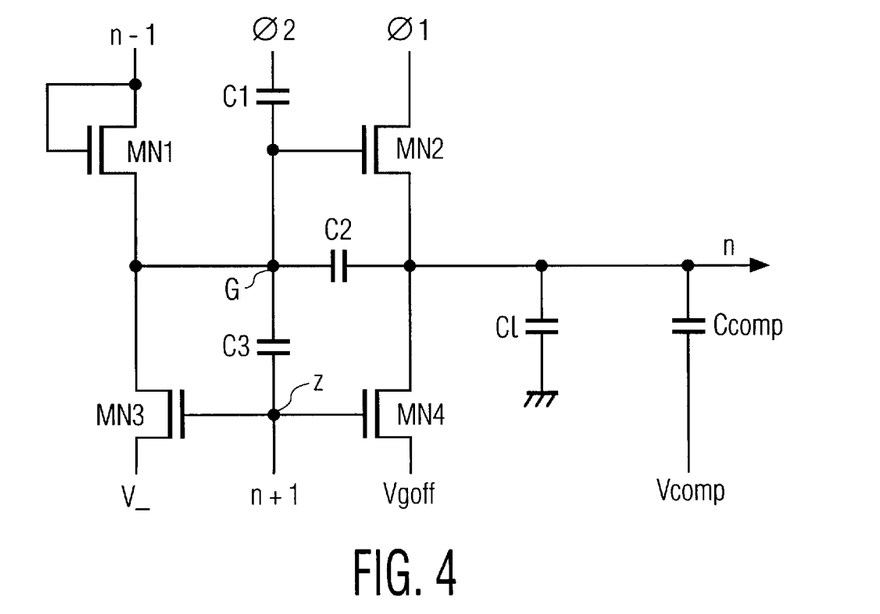
FIGS. 4 to 8 represent various enhancements made to the stage of the shift register represented in FIG. 3.

In accordance with the present invention and, as represented in FIG. 4, a first enhancement of the stage of a shift register according to FIG. 3 consists of a capacitance C3 mounted between the node z for connection to the next stage n+1 and the node G. This capacitance makes it possible to delay the fall in the voltage applied to the gate of the output transistor MN2. The use of such a capacitance gives greater margin in the dimensioning of the discharge transistor MN3 and makes it possible to optimize the fall time of line n. Thus, when the clock φ1 is at a high level and the output line is at a high level, the voltage applied to the gate of the transistor MN2 tends to follow the output voltage. When the line is deselected, the clock φ1 passes to zero. The transistor MN2 being on, it allows the output n to fall back to a low voltage. The next stage of the shift register, namely n+1, passes to a high level. In this case, the transistors MN3 and MN4 are active. The transistor MN4 has the effect of taking a line to zero whereas the transistor MN3 has the effect of causing the gate voltage of the transistor MN2 to fall. By using the capacitance C3, when the charging transistor MN1 comes on, the voltage at the point G increases. Therefore, the transistor MN4 comes on and through capacitive coupling, the transistor MN4 tends to follow the voltage applied to the transistor MN2. Hence, the discharging of the gate of the transistor MN2 is delayed.

Figure 5:
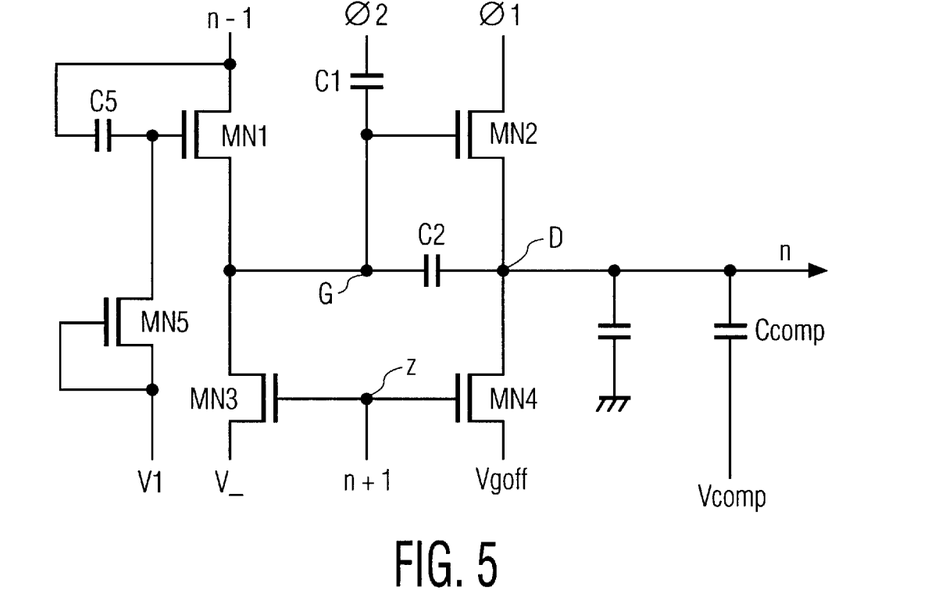

According to another enhancement such as represented in FIG. 5, means are provided for latching the control voltage of the second semiconductor device MN1 at a value less than or equal to zero. The semiconductor device MN1 normally consists in FIG. 3 of a diode-mounted MOS transistor, that is to say its gate is connected to its drain. In the enhancement represented in FIG. 5, there is provided a capacitance C5 mounted between the gate of the transistor MN1 and the drain of this transistor, namely the output of the preceding stage n−1. A supplementary semiconductor device MN5 is moreover provided, also consisting of a diode-mounted MOS transistor. This transistor MN5 is connected between the capacitance C5 and the gate of the transistor MN1 at one of its electrodes, its other electrode being connected to a voltage V1 which, preferably, is chosen such that V1≦V− ≦Vgoff. Furthermore, the gate of the transistor MN5 is connected to V1. The use of the coupling capacitance C5 and of the transistor MN5 which operates as a leakage transistor makes it possible to latch the charging transistor MN1 correctly in such a way that the gate voltage at the transistor MN1 is less than or equal to zero. Thus, by capacitive coupling between the output line n−1 and the gate of the transistor MN1, when the output line n−1 falls to zero, the capacitance C5 is taken to a voltage less than zero. Therefore, the transistor MN1 is properly latched. Furthermore, the transistor MN5 serves as "clamp" diode for the voltage V1 so as to preclude the gate voltage of the transistor MN1 from falling too low.

Moreover, to optimize the operation of the stage described in FIG. 5, the capacitance C3 described with reference to FIG. 4 can be added to this stage between the node G and the node z.

Figure 6:
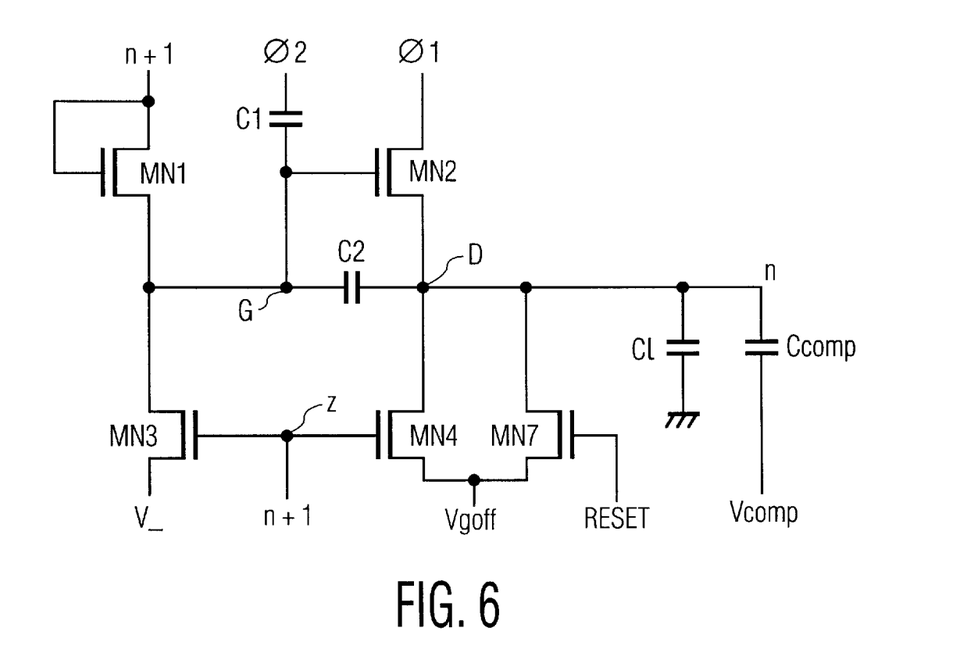

Another enhancement made to the stage of the shift register represented in FIG. 3 will now be described while referring to FIG. 6. In this case, means are provided for maintaining the output line n at a low level. As represented in FIG. 6, these means consist of a sixth semiconductor device MN7 connected between the output line n and a negative voltage Vgoff, the sixth semiconductor device being controlled by reset-to-zero pulses. More specifically, the sixth semiconductor device consists of a MOS transistor MN7 whose two electrodes are connected between the output line n and the negative voltage Vgoff and whose gate receives reset-to-zero pulses referenced Reset.

The MOS transistor MN7 makes it possible to maintain the line at a low level independently of the leakage through the output transistor MN2. In fact, the transistor MN7 resets the capacitance Cl to the negative voltage Vgoff with each half clock period.

Figure 7:
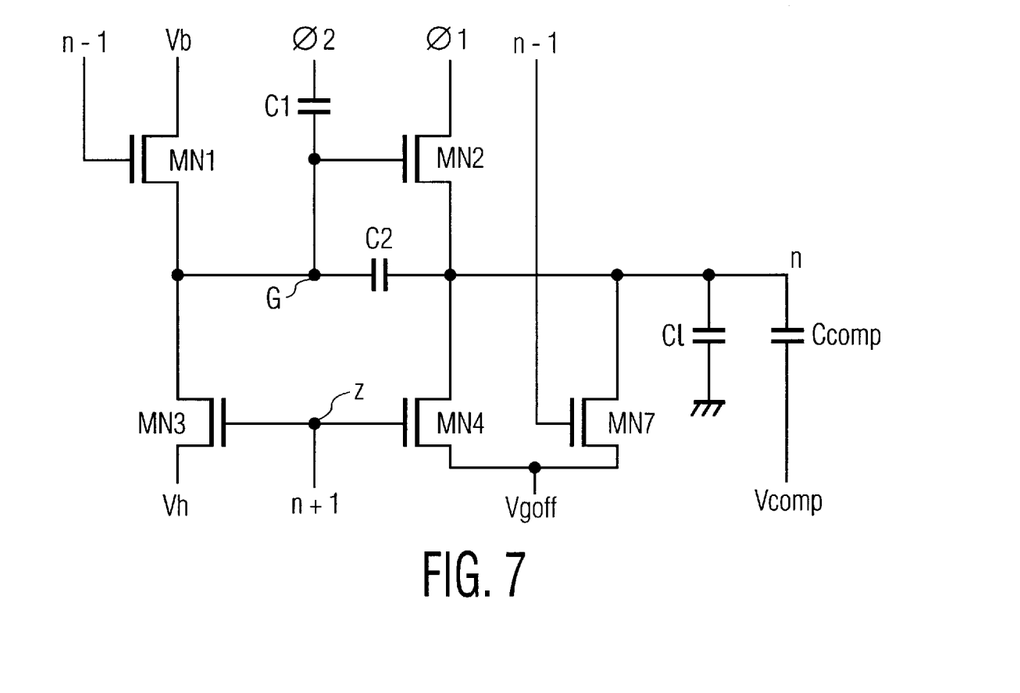

A particular embodiment which allows the stage of the shift register to operate in a bi-directional manner will now be described with reference to FIG. 7. This stage makes it possible to shift the information from stage n−1 to stage n+1 or from stage n+1 to stage n−1 depending on the polarity of the voltages Vh and Vb applied to the electrodes of the MOS transistors MN1 and MN3 used respectively for charging and discharging the output transistor MN2. Thus, as represented clearly in FIG. 7, the gate of the precharge transistor MN1 is connected directly to the output of stage n−1 and one of its electrodes connected to the voltage Vb which can be chosen at a high level or at a low level. Moreover, the gate of the discharge transistor MN3 is connected in conventional manner to the stage n+1 and one of its electrodes connected to the voltage Vh which is chosen at a low level or at a high level depending on the voltage Vb. In the embodiment represented in FIG. 7, the sixth semiconductor device MN7 connected between the output line n and the output voltage Vgoff is used, but this semiconductor device consisting of an MOS transistor has its gate linked to the preceding stage n−1 in such a way as to reset the capacitance Cl to the voltage Vgoff with each passage from stage n−1 to stage n or vice versa.

The stage of the shift register described with reference to FIG. 7 has the drawback of being sensitive to current leakages through the transistors MN1 or MN3 depending on the direction of operation. Thus, in the embodiment of FIG. 3, the voltage V− is in general less than the voltage Vgoff so that, in an unselected stage, the output transistor MN2 has a sufficiently small output current as not to charge the capacitance Cl when the clock becomes positive. Typically, for transistors based on amorphous silicon, V−≦Vgoff−2 volts.

Figure 8:
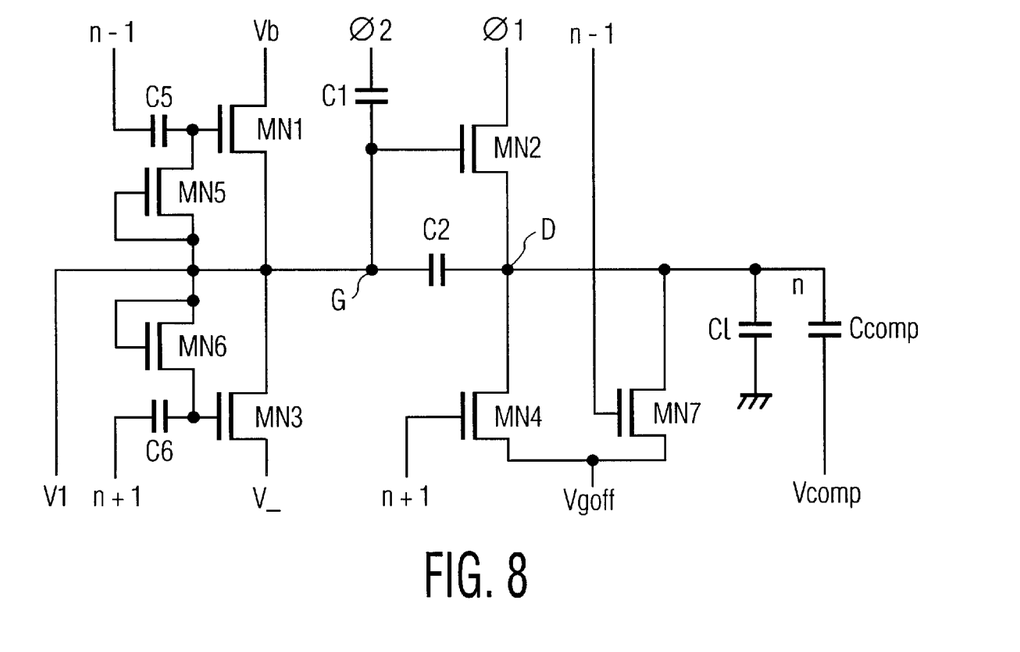

To remedy this drawback, the solution represented in FIG. 8 is used. In this case, the gate of the transistor MN1 is connected to the output line of the preceding stage by way of a coupling capacitance C5, as in the embodiment of FIG. 5, and a diode-mounted MOS transistor MN5 is connected between the common point between the capacitance C5 and the gate of the transistor MN1 and the point G. Likewise, the discharge transistor MN3 is connected to the next stage by way of a coupling capacitance C6 and which also includes a "clamp" diode consisting of a transistor MN6. In the embodiment of FIG. 8, it is seen that the node G is linked to the voltage V1. In fact, in the embodiments of FIGS. 7 and 8, the transistors MN1 and MN3 play a symmetric role making it possible to operate the stage bi-directionally.

It is obvious to a person skilled in the art that the various enhancements described above may be combined with one another, as mentioned in the claims below.

What is claimed is:

1. Shift register containing a plurality of cascaded stages, each stage containing an output at a first node connected to a next stage, a first input connected to an output of a preceding stage, a second input connected to an output of the next stage and a first terminal connected to a first clock signal and a second terminal connected to a second clock signal, the said stage containing a first semiconductor device switching the output of said stage between high and low values of the first clock signal, the first semiconductor device being controlled by the potential of a second node, itself connected:

to the output of the preceding stage across a second semiconductor device controlled by the output of the preceding stage;
   to a first negative voltage across a third semiconductor device controlled by the output of the next stage;
   to the second terminal connected to the second clock signal across a first capacitance,
   wherein a second capacitance is mounted between the second node and the output of the next stage.

2. Register according to claim 1, wherein the output of the said stage is linked to a second negative voltage across a fourth semiconductor device controlled by the output of the next stage or a stage following the next stage.

3. Register according to claim 1, further comprising means for latching a control voltage of the second semiconductor device at a value less than or equal to zero.

4. Register according to claim 3, wherein said means for latching the control voltage of the second semiconductor device includes a third capacitance connected between a control input of the second semiconductor device and the output of the preceding stage and a fourth semiconductor device connected between the control input of the second semiconductor device and a first voltage, the fourth semiconductor device being controlled by the said first voltage.

5. Register according to claim 4, wherein said first voltage is chosen such that said first voltage is less than or equal to said first negative voltage, and said first negative voltage is less than or equal to a second negative voltage.

6. Register according to claim 1, further comprising means for maintaining the output line at a low level.

7. Register according to claim 6, wherein the means for maintaining the output line at a low level includes a semiconductor device connected between the output line and a negative voltage, the semiconductor device being controlled by reset-to-zero pulses.

8. Shift register containing a plurality of cascaded stages, each stage containing an output at a first node connected to a next stage, a first input connected to an output of a preceding stage, a second input connected to an output of the next stage, a first terminal connected to a first clock signal and a second terminal connected to a second clock signal, the said stage containing a first semiconductor output device switching the output between high and low values of the first clock signal, the first semiconductor device being controlled by the potential of a second node, itself connected:

to the output of the preceding stage across a second semiconductor device controlled by the output of the preceding stage;
   to a first negative voltage across a third semiconductor device controlled by the output of the next stage;
   to the terminal connected to the second clock signal across a first capacitance, wherein said register further includes
   means for latching a control voltage of the second semiconductor device at a value less than or equal to zero.

9. Register according to claim 8, wherein said means for latching the control voltage of the second semiconductor device includes a third capacitance connected between a control input of the second semiconductor device and the output of the preceding stage and another semiconductor device connected between the control input of the second semiconductor device and a first voltage, the another semiconductor device being controlled by the first voltage.

10. Register according to claim 9, wherein said first voltage is chosen such that said first voltage is less than or equal to said first negative voltage, and said first negative voltage is less than or equal to a second negative voltage.

11. Register according to claim 8, wherein the output of the said stage is linked to a second negative voltage, across a fourth semiconductor device controlled by the output of the next stage or of a stage following the next stage.

12. Register according to claim 8, further comprising means for maintaining the output line at a low level.

13. Register according to claim 12, wherein said means for maintaining the output line at a low level includes a semiconductor device connected between the output line and a second negative voltage, the semiconductor device being controlled by reset-to-zero pulses.

14. Shift register containing a plurality of cascaded stages, each stage containing an output at a first node connected to a next stage, a first input connected to an output of a preceding stage, a second input connected to an output of the next stage a first terminal connected to a first clock signal and a second terminal connected to a second clock signal, the said stage containing a first semiconductor output device switching the output between high and low values of the first clock signal, the first semiconductor device being controlled by the potential of a second node, itself connected:

to the output of the preceding stage across a second semiconductor device controlled by the output of the preceding stage;
   to a first negative voltage across a third semiconductor device controlled by the output of the next stage;
   to the second terminal connected to the second clock signal across a first capacitance, wherein said shift register further includes means for maintaining the output line at a low level.

15. Register according to claim 14, wherein said means for maintaining the output line at a low level includes a semiconductor device connected between the output line and a second negative voltage, the semiconductor device being controlled by reset-to-zero pulses.

16. Register according to claim 14, wherein the output of the said stage is linked to a second negative voltage across a fourth semiconductor device controlled by the output of the next stage or a stage following the next stage.

17. Shift register containing a plurality of cascaded stages, each stage containing an output at a first node connected to a next stage, a first input connected to an output of a preceding stage, to an output of a next stage, a first terminal connected to a first clock signal and a second terminal connected to a second clock signal, the said stage containing a first semiconductor output device switching the output between high and low values of the first clock signal, the first semiconductor device being controlled by the potential of a second node, itself connected:

- to the second terminal connected to the second clock signal across a first capacitance: wherein it is connected moreover:
- to a first high or low potential across a second semiconductor device controlled by the output of the preceding stage, and
- to a second low or high potential across a third semiconductor device controlled by the output of the next stage.

18. Register according to claim 17, further including a semiconductor device connected between the output line and a negative voltage, the semiconductor device being controlled by the output of the preceding stage.

19. Register according to claim 17, wherein the output of the said stage is linked to a negative voltage across a fourth semiconductor device controlled by the output of the next stage or a stage following the next stage.

20. Register according to claim 17, wherein:

the second node is connected to a first voltage;

and wherein said register further includes means for latching the control voltage of the second and third semiconductor devices at a value less than or equal to zero.

21. Register according to claim 20, wherein the means for latching include a second and third capacitance connected between control inputs of the said second and third semiconductor devices and the second node, fourth and fifth semiconductor devices being connected respectively between the control inputs of the second or of the third semiconductor devices and the second node, the fourth and fifth semiconductor devices being controlled by the first voltage at the second node.

* * * * *